(12) United States Patent
Trivedi et al.

(10) Patent No.: US 6,566,758 B1
(45) Date of Patent: May 20, 2003

(54) CURRENT CROWDING REDUCTION TECHNIQUE FOR FLIP CHIP PACKAGE TECHNOLOGY

(75) Inventors: Pradeep Trivedi, Sunnyvale, CA (US); Tyler Thorp, Sunnyvale, CA (US); Sudhakar Bobba, Sunnyvale, CA (US); Dean Liu, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/995,168

(22) Filed: Nov. 27, 2001

(51) Int. Cl.$^7$ ................................................ H01L 23/48
(52) U.S. Cl. ..................... 257/774; 257/778; 257/786; 438/629; 438/666
(58) Field of Search ............... 438/106, 108, 438/612, 613, 614, 622, 629, 637, 666; 257/734, 737, 738, 774, 779, 780, 781, 786, 700, 701, 758, 759, 760, 773, 778, 702; 228/180.21, 180.22

(56) References Cited

U.S. PATENT DOCUMENTS

| | | | | | |
|---|---|---|---|---|---|
| 5,248,903 | A | * | 9/1993 | Heim ........................... | 257/748 |
| 5,700,735 | A | * | 12/1997 | Shiue et al. ................. | 438/612 |
| 5,736,791 | A | * | 4/1998 | Fujiki et al. ................. | 257/781 |
| 5,962,919 | A | * | 10/1999 | Liang et al. ................. | 257/748 |
| 6,306,749 | B1 | * | 10/2001 | Lin .............................. | 438/612 |
| 6,448,641 | B2 | * | 9/2002 | Ker et al. .................... | 257/700 |

* cited by examiner

*Primary Examiner*—David L. Talbott
*Assistant Examiner*—Alonzo Chambliss
(74) *Attorney, Agent, or Firm*—Rosenthal&Osha L.L.P.

(57) ABSTRACT

A current crowding reduction technique involving the uniform displacement of vias around a bump is provided. By uniformly arranging vias around the bump on an integrated circuit, current can uniformly flow to and from the bump, effectively leading to reduced current density around the bump. Further, a method for reducing current crowding around a bump using an uniform arrangement of vias around the bump is provided.

13 Claims, 7 Drawing Sheets

US 6,566,758 B1

CURRENT CROWDING REDUCTION TECHNIQUE FOR FLIP CHIP PACKAGE TECHNOLOGY

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer circuit board (10) having a microprocessor (12), memory (14), integrated circuits (16) that have various functionalities, and communication paths (18), i.e., buses and wires, that are necessary for the transfer of data among the aforementioned components on the circuit board (10).

A microprocessor, such as the one shown in FIG. 2, is electrically connected to a circuit board via a chip package. A chip package, which houses semiconductor devices in strong, thermally stable, hermetically sealed environments, provides a semiconductor device, e.g., the microprocessor, with electronically connectivity to circuitry external to the semiconductor device. FIG. 2 shows one prior art type of chip package assembly that involves wire bond connections. The wire bonding process involves mounting a microprocessor (30) to a substrate (32) with its inactive backside (34) down. Wires (not shown) are then bonded between an active side (36) of the microprocessor (30) and the chip package (not shown).

FIG. 3 shows a more recently developed type of chip package assembly known as "flip-chip" packaging. In flip-chip package technology, a microprocessor (40) is mounted onto a chip package (42), where the active side of the microprocessor (40) is electrically interfaced to the chip package (42). Specifically, the microprocessor (40) has bumps (44) on bond pads (not shown) formed on an active side (46) of the microprocessor (40), where the bumps (44) are used as electrical and mechanical connectors. The microprocessor (40) is inverted and bonded to chip package (42) by means of the bumps (44). Various materials, such as conductive polymers and metals (referred to as "solder bumps"), are commonly used to form the bumps (44) on the microprocessor (40).

As discussed above with reference to FIG. 3, the bumps (44) on the microprocessor (40) serve as electrical pathways between the components within the microprocessor (40) and the chip package (42). Within the microprocessor (40) itself, an arrangement of conductive pathways and metal layers form a means by which components in the microprocessor (40) operatively connect to the bumps (44) on the outside of the microprocessor (40). To this end, FIG. 4a shows a side view of the microprocessor (40). The microprocessor (40) has several metal layers, M1–M8, surrounded by some dielectric material (48), e.g., silicon dioxide. The metal layers, M1–M8, are connected to each other by conductive pathways (50) known as "vias." Vias (50) are essentially holes within the dielectric material (48) that have been doped with metal ions, e.g., boron ions.

Circuitry (not shown) embedded on a substrate of the microprocessor (40) transmit and receive signals via the metal layers, M1–M8, and the vias (50). Signals that need to be transmitted/received to/from components external to the microprocessor (40) are propagated through the metal layers, M1–M8, and vias (50) to the top metal layer, M8. The top metal layer, M8, then transmits/receives signals and power to/from the bumps (44) located on the active side of the microprocessor (40).

FIG. 4b shows a top view of the microprocessor (40) shown in FIG. 4a. The top metal layer, M8, as shown in FIG. 4b, has a number of parallel regions (60). These parallel regions (60) alternate between regions connected to $V_{DD}$ and regions connected to $V_{SS}$. Such a configuration helps reduce electromagnetic interference. The top metal layer, M8, is configured such that it is orthogonal with the metal layer below, M7, as shown in FIG. 4b. Further, bumps (44) on the top metal layer, M8, are arranged in a non-uniform fashion with some areas of the top metal layer, M8, having larger numbers of bumps (44) than other areas.

FIG. 4c shows a section of the microprocessor (40) shown in FIG. 4b. Particularly, FIG. 4c shows a particular bump (44). The bump (44) shown in FIG. 4c is connected to the top metal layer, M8. On opposing sides of the bump (44), there are vias (50) that connect the bump (44), the top metal layer, M8, and the metal layer below, M7.

Vias (50) provide current paths across the junction between the bump (44) and the top metal layer, M8. The part of the top metal layer, M8, that makes contact with the bump is known as a "landing pad." Thus, from the bump (44), via the landing pad, current is carried away from the bump (44) toward the vias (50). Arrows indicating the flow of current from the bump (44) to the vias (50) are shown for illustration purposes in FIG. 4c. Although the vias (50) facilitate current flow, because the vias (50) are positioned on only two sides of the bump, there is non-uniform current density at the junction between the bump (44) and the top metal layer, M8. This non-uniform current density, resulting from the placement of vias (50) around the bump (44), is known as "current crowding." In this current crowding phenomenon, there is high current density on the sides of the bump (44) that are in close proximity to the vias (50) and there is low current density in the rest of the junction between the bump (44) and the top metal layer, M8. Current crowding is a typically undesirable effect because prolonged exposure to current crowding damages the bump (44) and areas of the top metal layer, M8, subjected to current crowding.

SUMMARY OF INVENTION

According to one aspect of the present invention, an integrated circuit comprises a landing pad, a bump positioned on and electrically connected to the landing pad, and a plurality of vias positioned uniformly around the bump and electrically connected to the landing pad, where current supplied to the bump is distributed to the vias, and wherein the vias connect the landing pad to a metal layer in the integrated circuit.

According to another aspect, an integrated circuit adapted for use with a flip-chip package comprises a landing pad, a bump positioned on the landing pad, and a plurality of vias positioned uniformly around the bump and electrically connected to the landing pad, where the bump electrically connects the integrated circuit and flip-chip package, where current supplied to the bump from the flip-chip package is distributed to the vias, and where the vias connect the landing pad to a metal later in the integrated circuit.

According to another aspect, a method for uniform current transmission around a bump of an integrated circuit comprises disposing a plurality of vias uniformly around a bump, distributing current supplied to the bump to the vias, and distributing current supplied to the vias to the bump, where the vias are arranged uniformly around the bump, and where the vias connect the bump to a metal layer in the integrated circuit.

According to another aspect, a method for adapting an integrated circuit adapted use with a flip-chip package comprises positioning a bump on a landing pad, positioning a plurality of vias uniformly around the bump, and distributing current supplied to the bump from the flip-chip package to the vias, where the bump electrically connects the integrated circuit and flip-chip package, where the vias are electrically connected to the landing pad, and where the vias connect the landing pad to a metal later in the integrated circuit.

Other aspects and advantages of the invention will be apparent from the following description and the appended claims.

BRIEF DESCRIPTION OF DRAWINGS

FIG. 4b shows another view of the typical microprocessor shown in FIG. 4a.

FIG. 5b shows a side view of a bump and vias structure in accordance with the embodiments shown in FIG. 5a.

FIG. 6b shows a side view of a bump and vias structure in accordance with the embodiment shown in FIG. 6a.

DETAILED DESCRIPTION

Embodiments of the present invention relate to a bump and vias structure that allows for increased uniformity of current distribution around the bump. Embodiments of the present invention further relate to a method for reducing current crowding by more uniformly distributing current to/from a bump. Embodiments of the present invention further relate to a microprocessor structure that decreases current crowding in a flip chip package.

Figure 1:
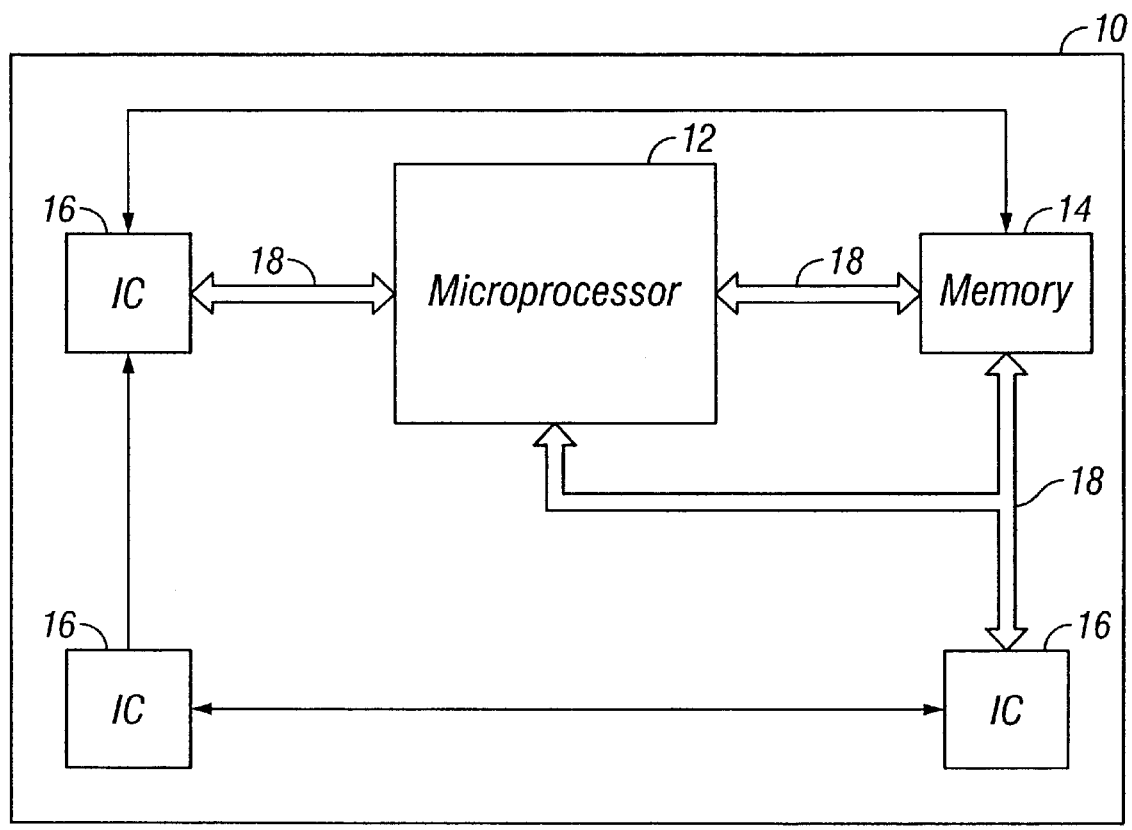
FIG. 1 shows a typical computer system.
Figure 2:
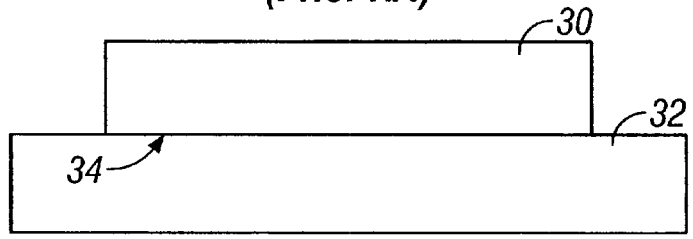
FIG. 2 shows a typical chip package assembly.
Figure 3:
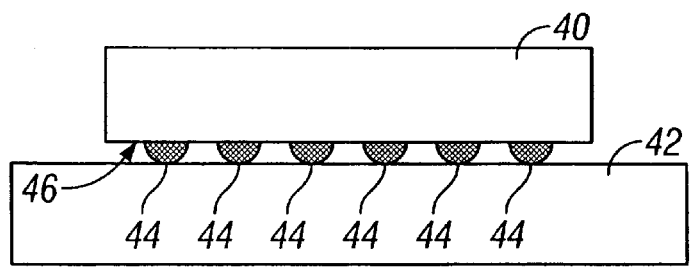
FIG. 3 shows a typical flip-chip package assembly.
Figure 4A:
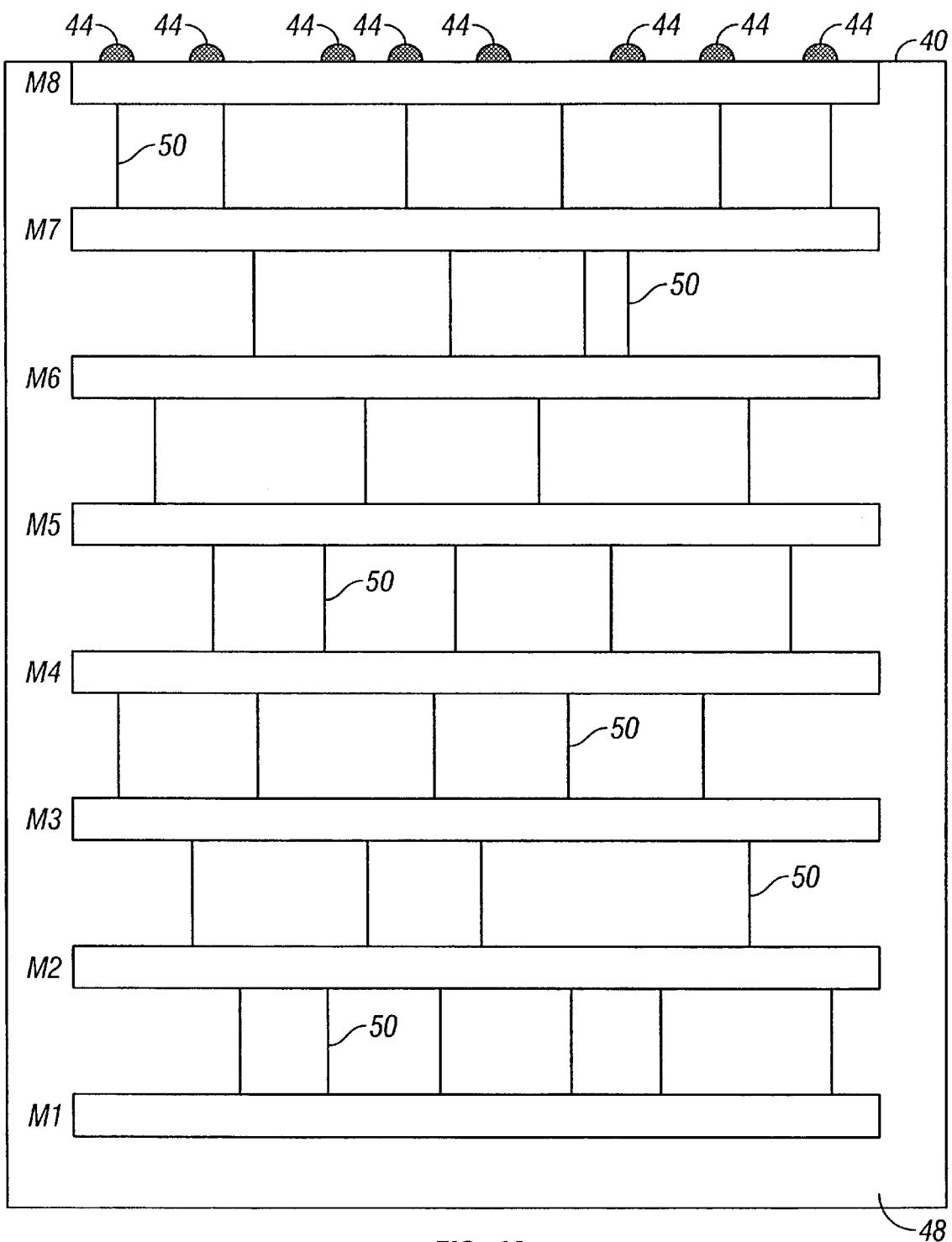
FIG. 4a shows a view of a typical microprocessor.
Figure 4B:
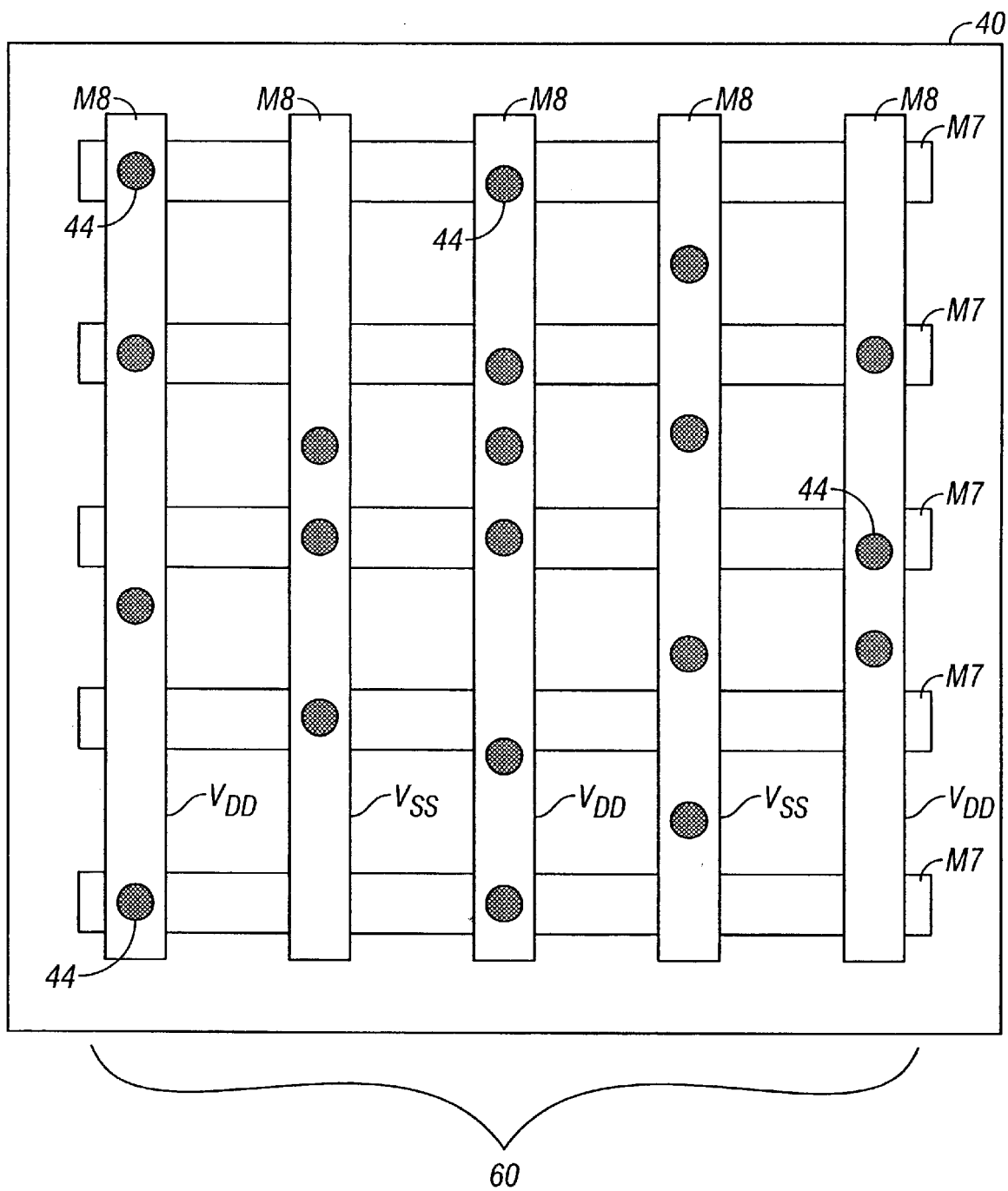
Figure 4C:
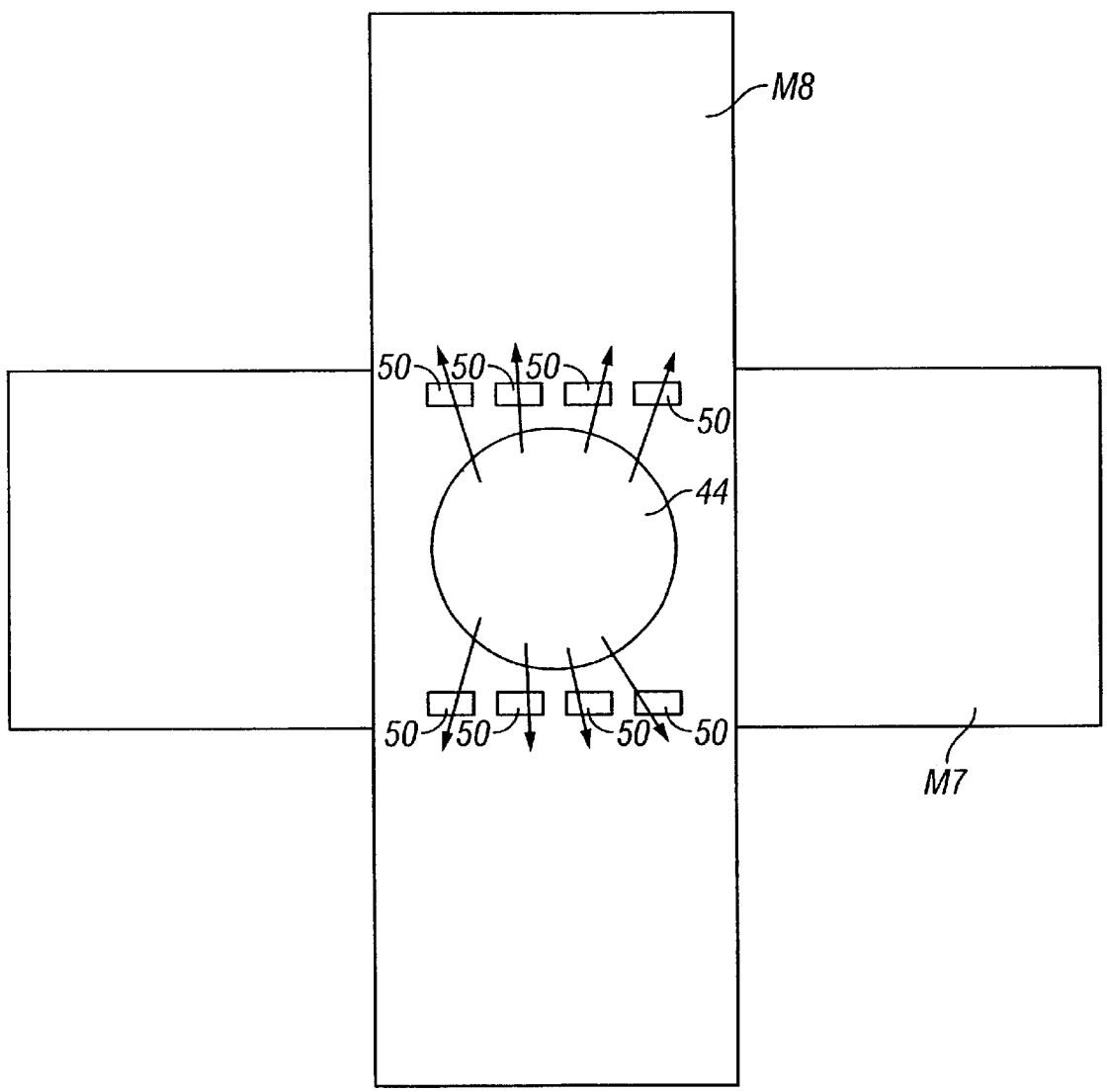
FIG. 4c shows a section of the typical microprocessor shown in FIG. 4b.
Figure 5A:
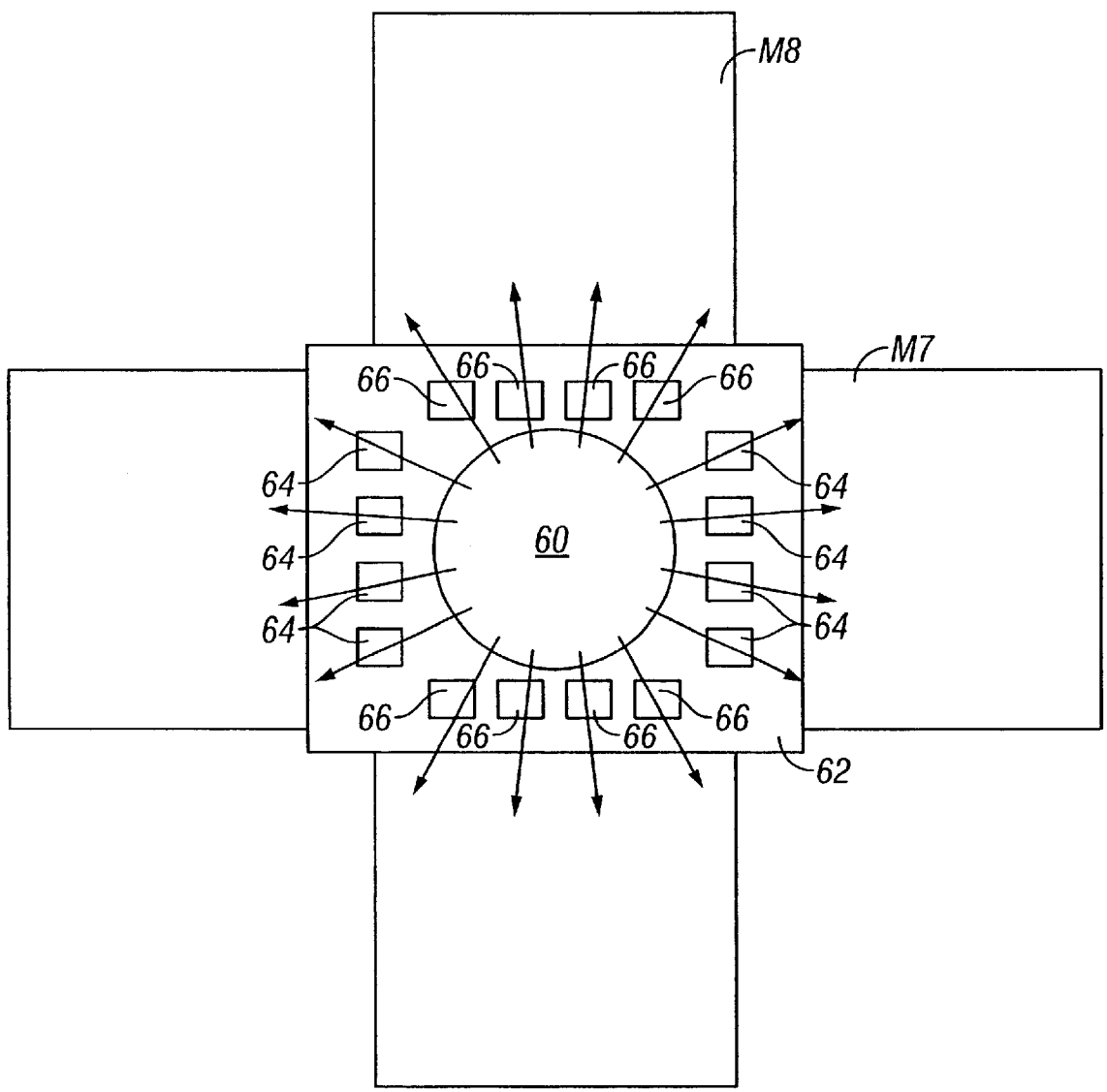
FIG. 5a shows a top view of a bump and vias structure in accordance with an embodiment of the present invention.

FIG. 5a shows an exemplary bump and vias structure in accordance with an embodiment of the present invention. A bump (60) is attached to a landing pad (62), where the landing pad (62) is connected to a top metal layer, M8. Vias (64, 66) surround the bump (60) in a rectangular fashion. In some embodiments, the vias (64, 66) may be viewed as a first set of vias (64) and a second set of vias (66). The first set of vias (64) is arranged in two substantially straight lines located on opposite sides of the bump (60). A second set of vias (66) is arranged in two substantially straight lines located on a different set of opposing sides of the bump (60). The two sets of vias (64, 66) surround the bump (60). Arrows indicating the flow of current from the bump (60) to the vias (64, 66) are shown for illustration purposes in FIG. 5a.

Figure 5B:
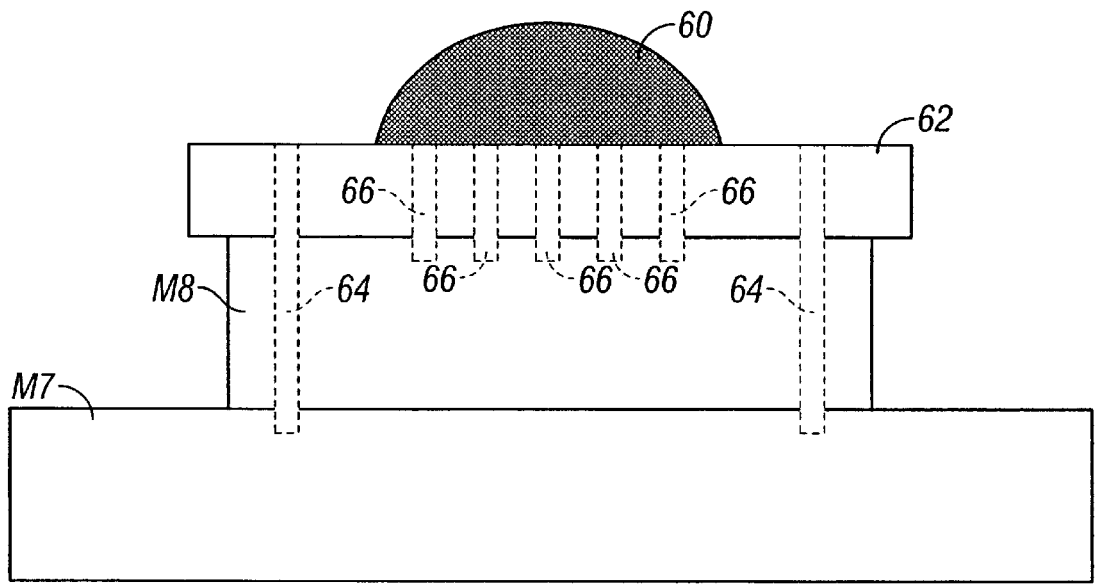

FIG. 5b shows a side view of the exemplary bump and vias structure shown in FIG. 5a. The first set of vias (64) extend downward through the landing pad (62) and terminate in the top metal layer, M8. The first set of vias (64) allow for current to flow from the bump (60) to the top metal layer, M8.

The second set of vias (66) extend downward through the landing pad (62) and the top metal layer, M8, and terminate in the metal layer below, M7, the top metal layer, M8. The second set of vias (66) allows for current to flow from the bump (60) to the metal layer below, M7. The arrangement of the first and second set of vias (64, 66) allow current to be transmitted in all directions, within the horizontal plane of the landing pad (62), effectively resulting in less current density as well as a more uniform current density. Accordingly, those skilled in the art will appreciate that the implementation of the bump (60) and vias (64, 66) as discussed above with reference to FIGS. 5a and 5b results in a decrease, or even elimination, of current crowding at the bump (60).

Figure 6B:
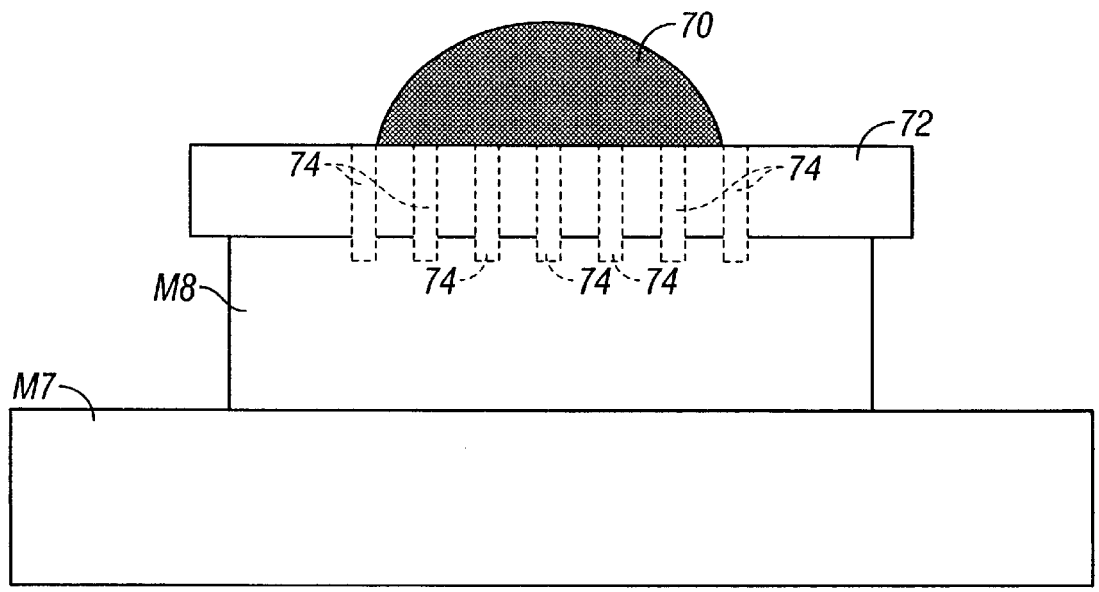
Figure 6A:
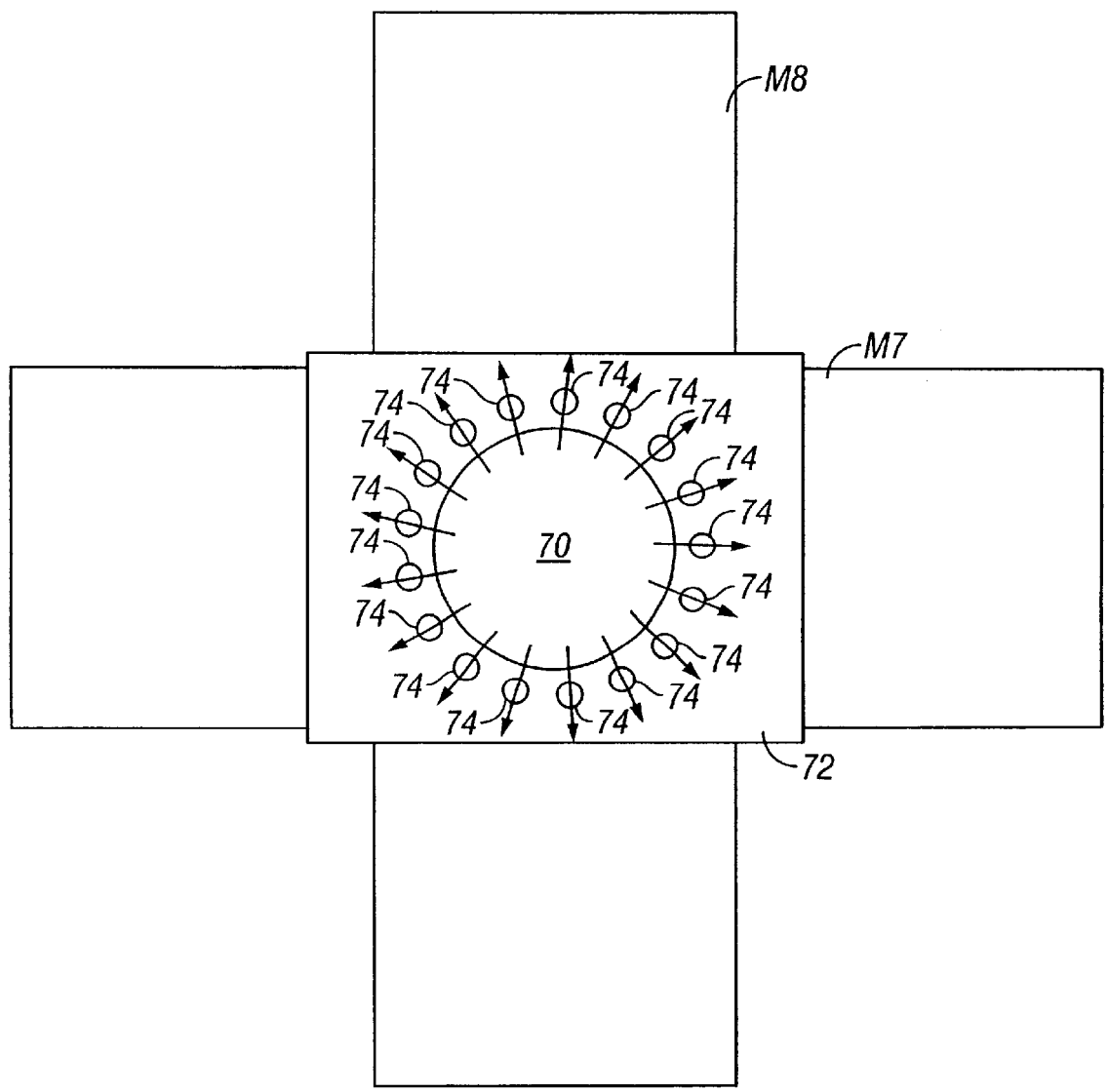
FIG. 6a shows a top view of a bump and vias structure in accordance with another embodiment of the present invention.

FIG. 6a shows an exemplary bump and vias structure in accordance with another embodiment of the present invention. A bump (70) is attached to a top portion of a landing pad (72). The landing pad (72) is attached to a top metal layer, M8. Vias (74) are arranged such that they surround the bump (70) in a circular fashion, i.e., the vias (74) are circularly arranged around the bump (70). This circular arrangement of vias (74) provides multiple paths upon which current may travel. Arrows indicating the flow of current from the bump (70) to the vias (74) are shown for illustration purposes in FIG. 6a. This current flow results in less, overall current density around the bump (70) and a subsequent reduction in current crowding at the bump (70).

FIG. 6b shows a side view of the exemplary bump and vias structure shown in FIG. 6a. The circularly arranged vias (74) extend downward through the landing pad (72) and terminate in the top metal layer, M8. Surrounding the bump (70), the circular arrangement of vias (74) allows for current to be transmitted in all directions, within the horizontal plane of the landing pad (72), effectively leading to less current density as well as a more uniform current density. Accordingly, those skilled in the art will appreciate that the implementation of the bump (70) and vias (74) as discussed above with reference to FIGS. 6a and 6b results in a decrease, or even elimination, of current crowding at the bump (70).

Those skilled in the art will appreciate that although embodiments of the present invention show the top metal layer as being layer M8, the top metal layer in other embodiments of the present invention may be a different layer number. For example, in an embodiment of the present invention where an integrated circuit has 20 metal layers, the top metal layer would be M20.

Further, those skilled in the art will appreciate that although the embodiments of the present invention show the cross sections of the individual vias to be in a particular shape, e.g., circular or rectangular, the individual vias may have cross sections of a different shape. Moreover, those skilled in the art will appreciate that although the embodiments of the present invention show vias to be positioned either in a rectangular or circular arrangement around a bump, the arrangement of vias around the bump may be in other arrangements as long as current from a bump flows in a more uniform distribution relative to current flow from only two sides of the bump.

Further, those skilled in the art will appreciate that the termination locations of the vias, e.g., the top metal layer, the metal layer below the top metal layer, etc., may be arranged differently in various embodiments while remaining consistent with the principles of the present invention. In other words, those skilled in the art will appreciate that vias as shown in the embodiments of the present invention may terminate in any metal layer.

Advantages of the present invention may include one or more of the following. In some embodiments, because vias are uniformly positioned around a bump so as to allow current to uniformly travel to/from the bump, current density at a junction between the bump and a top metal layer is decreased, effectively lead to less current crowding.

In some embodiments, because more uniform current density is provided around the bump, current flow to/from the bump improves.

In some embodiments, because more uniform current density is provided around a bump, physical degradation of the bump decreases.

In some embodiments, because current crowding is decreased by more uniformly arranging vias around a bump, current flow is less susceptible to current crowding effects, effectively leading to increased integrated circuit performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a landing pad;
   a bump positioned on and electrically connected to the landing pad; and
   a plurality of vias positioned uniformly around the bump and electrically connected to the landing pad,
   wherein the vias extend through the landing pad and terminate in a metal layer of the integrated circuit, and wherein the landing pad connects the bump to a top metal layer of the integrated circuit to allow current supplied to the bump to be distributed to the vias.

2. The integrated circuit of claim 1, wherein the vias are arranged circularly around the bump.

3. The integrated circuit of claim 1, wherein the vias are arranged rectangularly around the bump.

4. An integrated circuit for a flip-chip package, comprising:
   a landing pad;
   a bump positioned on the landing pad, wherein the bump electrically connects the integrated circuit and flip-chip package;
   a plurality of vias positioned uniformly around the bump and electrically connected to the landing pad,
   wherein the vias extend through the landing pad and terminate in a metal layer of the integrated circuit, wherein the landing pad connects the bump to a top metal layer of the integrated circuit to allow current supplied to the bump from the flip-chip package to be distributed to the vias.

5. The integrated circuit of claim 4, wherein current supplied to the bump from the vias is distributed to the flip-chip package.

6. The integrated circuit of claim 4, wherein the vias are arranged circularly around the bump.

7. The integrated circuit of claim 4, wherein the vias are arranged rectangularly around the bump.

8. A method for uniform current transmission around a bump of an integrated circuit, comprising:
   disposing a plurality of vias uniformly around a bump;
   distributing current supplied to the bump to the vias; and
   distributing current supplied to the vias to the bump,
   wherein the vias are arranged uniformly around the bump, wherein the vias extend through a landing pad and terminate in a metal layer of the integrated circuit and wherein the landing pad connects the bump to a top metal layer of the integrated circuit.

9. The method of claim 8, further comprising arranging the vias circularly around the bump.

10. The method of claim 8, further comprising arranging the vias rectangularly around the bump.

11. A method for fabricating an integrated circuit use with a flip-chip package, comprising:
    positioning a bump on a landing pad, wherein the bump electrically connects the integrated circuit and flip-chip package;
    positioning a plurality of vias uniformly around the bump, wherein the vias are electrically connected to the landing pad; and
    distributing current supplied to the bump from the flip-chip package to the vias,
    wherein the vias extend through the landing pad and terminate in a metal layer of the integrated circuit, and wherein the landing pad connects the bump to a metal layer of the integrated circuit.

12. The integrated circuit of claim 11, further comprising arranging the vias circularly around the bump.

13. The integrated circuit of claim 11, further comprising arranging the vias rectangularly around the bump.

* * * * *

UNITED STATES PATENT AND TRADEMARK OFFICE
CERTIFICATE OF CORRECTION

PATENT NO. : 6,566,758 B1
DATED : May 20, 2003
INVENTOR(S) : Pradeep Trivedi et al.

It is certified that error appears in the above-identified patent and that said Letters Patent is hereby corrected as shown below:

Column 6,
Line 21, place a comma after the word "circuit".
Line 28, place the word -- for -- in between "circuit" and "use".

Signed and Sealed this

Fourth Day of November, 2003

JAMES E. ROGAN
*Director of the United States Patent and Trademark Office*